US012562207B2

(12) United States Patent
Bains et al.

(10) Patent No.: US 12,562,207 B2
(45) Date of Patent: Feb. 24, 2026

(54) METHOD OF POLLING ROW HAMMER (RH) INDICATOR INSIDE MEMORY

(71) Applicant: Intel Corporation, Santa Clara, CA (US)

(72) Inventors: Kuljit S. Bains, Olympia, WA (US); Jongwon Lee, Portland, OR (US); Tomer Levy, Tel Aviv (IL); Bill Nale, Livermore, CA (US); Amir Ali Radjai, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 783 days.

(21) Appl. No.: 17/738,923

(22) Filed: May 6, 2022

(65) Prior Publication Data

US 2022/0262428 A1    Aug. 18, 2022

(51) Int. Cl.
| | |
|---|---|
| *G11C 11/40* | (2006.01) |
| *G11C 11/406* | (2006.01) |
| *G11C 11/4078* | (2006.01) |
| *G11C 11/4096* | (2006.01) |

(52) U.S. Cl.
CPC .. *G11C 11/40615* (2013.01); *G11C 11/40622* (2013.01); *G11C 11/4078* (2013.01); *G11C 11/4096* (2013.01)

(58) Field of Classification Search
CPC ........ G11C 11/40615; G11C 11/40622; G11C 11/4078; G11C 11/4096; G11C 7/1063; G11C 11/40603; G11C 11/40611; G06F 13/1689; G06F 13/1636
See application file for complete search history.

(56) References Cited

U.S. PATENT DOCUMENTS

| | | | |
|---|---|---|---|
| 9,087,602 B2 * | 7/2015 | Youn | ................. G11C 11/40618 |
| 10,141,034 B1 | 11/2018 | Zitlaw | |
| 11,011,215 B1 | 5/2021 | Parry et al. | |
| 11,631,448 B1 | 4/2023 | Lee et al. | |
| 2014/0006703 A1 | 1/2014 | Bains et al. | |

(Continued)

OTHER PUBLICATIONS

Extended European Search Report for Patent Application No. 23167111.6, Mailed Oct. 4, 2023, 12 pages.

(Continued)

*Primary Examiner* — Xiaochun L Chen
(74) *Attorney, Agent, or Firm* — Compass IP Law PC

(57) ABSTRACT

Methods and apparatus for row hammer (RH) mitigation and recovery. A host comprising a memory controller is configured to interface with one or more DRAM devices, such as DRAM DIMMs. The memory controller includes host-side RH mitigation logic and the DRAM devices include DRAM-side RH mitigation logic that cooperates with the host-side RH mitigation logic to perform RH mitigation and/or recovery operations in response to detection of RH attacks. The memory controller and DRAM device are configured to support an RH polling mode under which the memory controller periodically polls for RH attack detection indicia on the DRAM device that is toggled when the DRAM device detects an RH attack. The memory controller and DRAM device may also be configured to support an RH ALERT_n mode under which the use of an ALERT_n signal and pin is used to provide an alert to the memory controller to initiate RH mitigation and/or recovery.

20 Claims, 8 Drawing Sheets

- ACT : Activate command
- RFM : Refresh management command
- RH : Row Hammer

(56)                References Cited

U.S. PATENT DOCUMENTS

| | | |
|---|---|---|
| 2014/0059287 A1 | 2/2014 | Bains et al. |
| 2014/0355332 A1 | 12/2014 | Youn et al. |
| 2015/0109871 A1 | 4/2015 | Bains et al. |
| 2016/0005457 A1 | 1/2016 | Bains |
| 2016/0225434 A1 | 8/2016 | Halbert et al. |
| 2016/0254044 A1 | 9/2016 | Bains et al. |
| 2016/0276015 A1 | 9/2016 | Bains et al. |
| 2017/0076779 A1 | 3/2017 | Bains et al. |
| 2017/0076780 A1 | 3/2017 | Bains |
| 2017/0092350 A1 | 3/2017 | Halbert et al. |
| 2017/0236575 A1 | 8/2017 | Querbach et al. |
| 2017/0365324 A1 | 12/2017 | Bains et al. |
| 2018/0025771 A1 | 1/2018 | Bains |
| 2018/0158507 A1 | 6/2018 | Bang |
| 2018/0174639 A1 | 6/2018 | Bains et al. |
| 2019/0066759 A1 | 2/2019 | Nale |
| 2019/0066808 A1 | 2/2019 | Nale |
| 2019/0073161 A1 | 3/2019 | Nale |
| 2019/0108870 A1 | 4/2019 | Bains |
| 2019/0228813 A1 | 7/2019 | Nale et al. |
| 2020/0117393 A1 | 4/2020 | Boehm et al. |
| 2021/0020262 A1 | 1/2021 | Penney et al. |
| 2021/0264999 A1 | 8/2021 | Bains et al. |
| 2022/0130484 A1 | 4/2022 | Prather et al. |
| 2022/0246201 A1 | 8/2022 | Kim et al. |

OTHER PUBLICATIONS

Hastings, et al.:, A New Doctrine For Hardware Security, arXiv:2007. 09537v1, Jul. 18, 2020. 10 pages.
JEDEC Standard, DDR5 Sdram, JEDEC Solid State Technology Association, JEDEC Standard No. 79-5, Jul. 2020, 5 pages. number(s), publisher, city and/or country where published.
First Office Action for U.S. Appl. No. 17/315,303, Mailed Jun. 10, 2024, 16 pages.
Final Office Action for U.S. Appl. No. 17/315,303, Mailed Oct. 28, 2024, 15 pages.
Kim, Yoongu, et al., "Flipping Bits in MemoryWithout Accessing Them: An Experimental Study of DRAM Disturbance Errors", ACM SIGARCH Computer Architecture News, vol. 42, Issue 3, Published: Jun. 14, 2014, 12 pages.

* cited by examiner

- ACT : Activate command
- RFM : Refresh management command
- RH : Row Hammer

- ACT : Activate command
- RFM : Refresh management command
- RH : Row Hammer

METHOD OF POLLING ROW HAMMER (RH) INDICATOR INSIDE MEMORY

BACKGROUND INFORMATION

Over the past few decades, the size of features in semiconductor devices has continued to shrink. Currently, the feature sizes may be a small as a few nanometers. This has led to the development of fabrication processes that support very dense memory devices, such as Double Date Rate $4^{th}$ generation (DDR4) and $5^{th}$ generation (DDR5) Dynamic Random Access Memory (DRAM) devices. This has exposed these higher density memory devices to Row Hammer (RH) attacks.

Row Hammer (also written as rowhammer) is a security exploit that takes advantage of an unintended and undesirable side effect in DRAM in which memory cells interact electrically between themselves by leaking their charges, possibly changing the contents of nearby memory rows that were not addressed in the original memory access. For example, consider that memory cells are arranged on two-dimensional DRAM devices in rows and columns, where data for a given physical memory address are written to cells in a row. Under one type of RH exploit or attack, data are repeatedly written (called a "hammer") to cells in a row (or rows) that are adjacent to the targeted row until the hammered row(s) leaks electricity into the targeted row. When done in a targeted way, that leakage can physically flip bits from 1 to 0 or vice versa. By strategically flipping enough bits, an attacker can begin to manipulate the target system and gain a digital foothold.

There are a few methods that have been used to mitigate/prevent RH attacks, but these have limitations. For example, error correction code (ECC) providing single-error correction and double-error correction can only address situations were the number of flipped bits in a memory Word is 1 or 2. Another approach is to increase the memory refresh intervals (usually 64 milliseconds), but this technique results in higher power consumption and lower performance, and doesn't guarantee the effect of RH attacks will be mitigated. The LPDDR4 (Low Power DDR4) mobile memory standard published by JEDEC includes optional hardware support for "target row refresh" (TTR) under which targeted rows are refreshed at higher rates rather than all rows. Recently, TTR mitigation has been shown to be deficient for some types of RH attacks. The DDR5 SDRAM standard published by JEDEC also includes measures for RH mitigation/prevention that are known to be deficient for some types of RH attacks.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Figure 1:
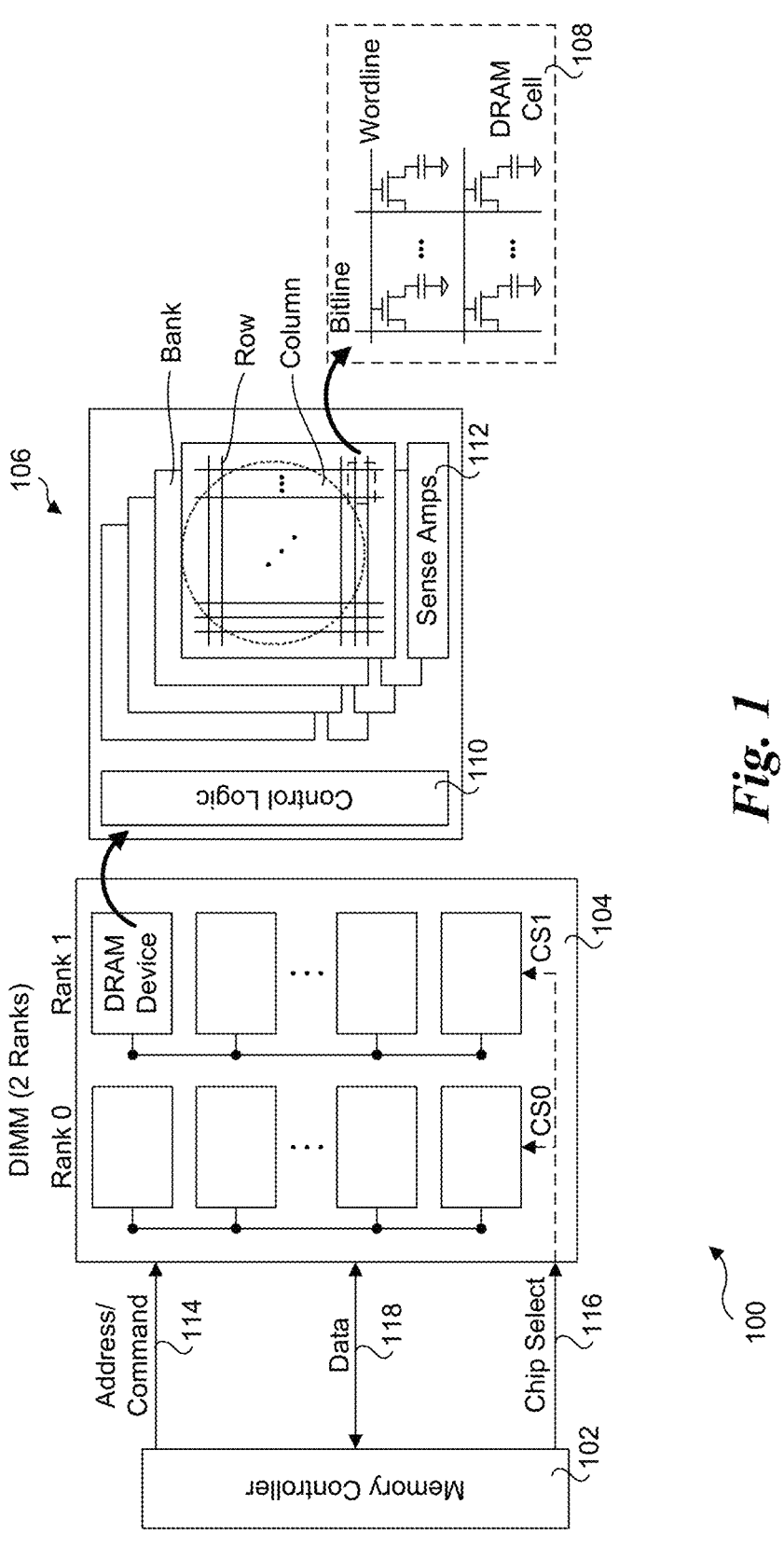
FIG. 1 is a diagram illustrating selective elements in a memory subsystem including a memory controller coupled to a DIMM showing two ranks of DRAM devices.

Embodiments of methods and apparatus for row hammer mitigation and recovery are described herein. In the following description, numerous specific details are set forth (such as to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

Figure 2:
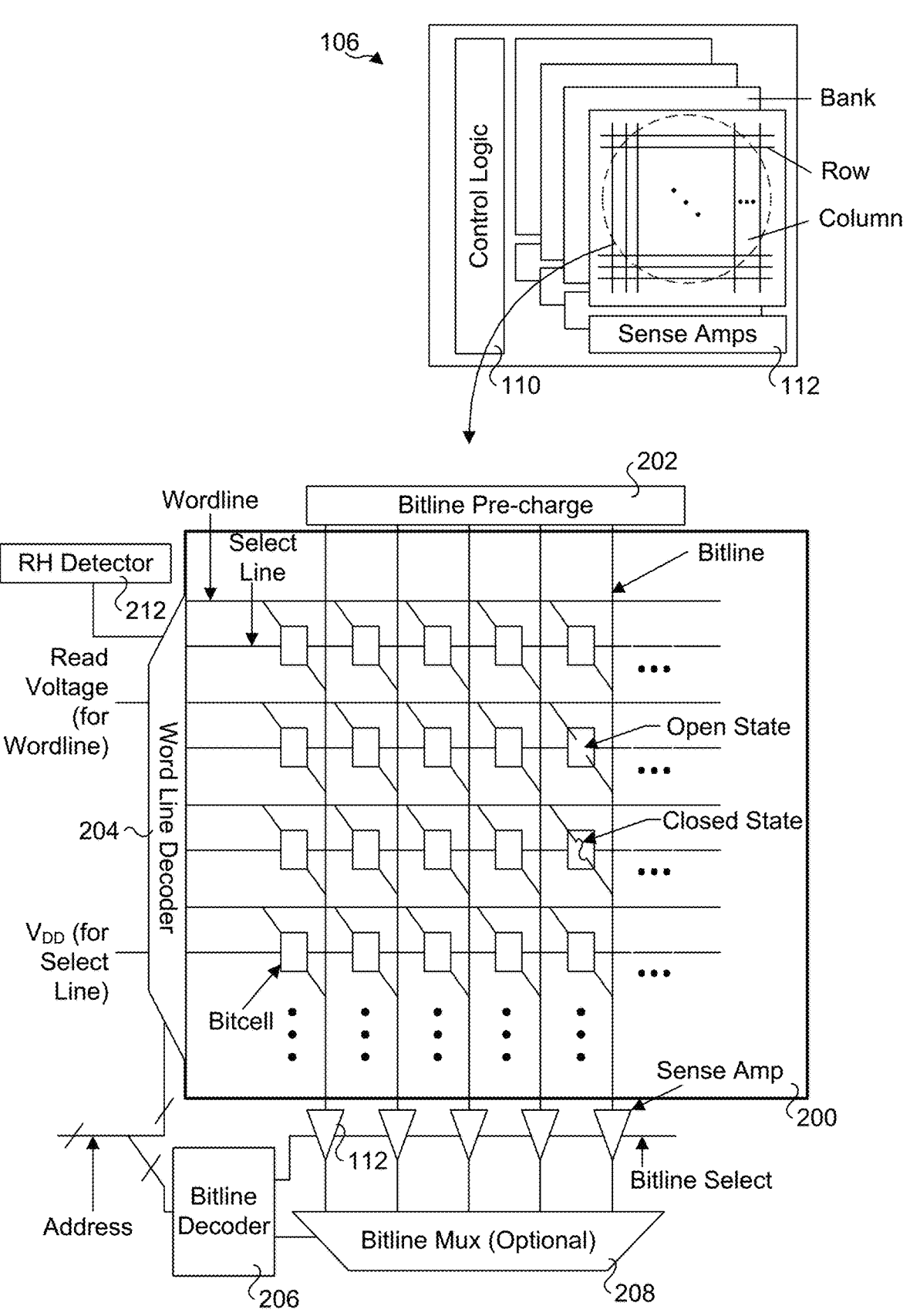
FIG. 2 is a schematic diagram of a DRAM memory structure.

To better understand aspects of the teachings and principles of the embodiments disclosed herein, a brief primer on the operation of DRAM is provided with reference an exemplary memory subsystem illustrated in FIGS. 1 and 2. As shown in FIG. 1, selective elements of a memory subsystem 100 include a memory controller 102 coupled to a MINIM 104 showing two ranks of DRAM devices 106. Generally, a DRAM DIMM may have one or more ranks. Each DRAM device includes a plurality of banks comprising an array of DRAM cells 108 that are organized (laid out) and as rows and columns. Each row comprises a Wordline (or wordline), while each column comprises a Bitline (or bitline). Each DRAM device 106 further includes control logic 110 and sense amps 112 that are used to access DRAM cells 108.

As further shown in FIG. 1, memory controller provides inputs comprising address/commands 114 and chip select 116. For memory Writes, the memory controller inputs further include data 118 that are written to DRAM cells 108 based on the address and chip select inputs. Similarly, for memory Reads, data 118 stored in DRAM cells 108 identified by the address and chip select inputs is returned to memory controller 102.

As described herein, reference to memory devices (e.g., DRAM devices) can apply to different volatile memory types. Volatile memory is memory whose state (and therefore the data stored on it) is indeterminate if power is interrupted to the device. Dynamic volatile memory requires refreshing the data stored in the device to maintain state. One example of dynamic volatile memory includes DRAM, or some variant such as synchronous DRAM (SDRAM). A memory subsystem as described herein may be compatible with a number of memory technologies or standards, such as DDR3 (double data rate version 3, JESD79-3, originally published by JEDEC (Joint Electronic Device Engineering Council) on Jun. 27, 2007), DDR4 (DDR version 4, JESD79-4, originally published in September 2012 by JEDEC), LPDDR3 (low power DDR version 3, JESD209-3B, originally published in August 2013 by JEDEC), LPDDR4 (low power DDR version 4, JESD209-4, originally published by JEDEC in August 2014), W102 (Wide I/O 2 (WideIO2), JESD229-2, originally published by JEDEC in August 2014), HBM (high bandwidth memory DRAM, JESD235, originally published by JEDEC in October 2013), LPDDR5 (originally published by JEDEC in February 2019), HBM2 ((HBM version 2), originally published by JEDEC in December 2018), DDR5 (DDR version 5, originally published by JEDEC in July 2020), or others or combinations of memory technologies, and technologies based on derivatives or extensions of such specifications.

Under conventional (S)DRAM memory, data are generally accessed (Read and Written) using cachelines (also called cache lines) comprising a sequence of memory cells (bits) in a wordline. The cachelines for a given memory architecture generally have a predetermined width or size, such as 64 Bytes, noting other widths/sizes maybe used.

Referring to FIG. 2, the DRAM device 106 structure includes a bank 200 including an array of memory cells called bitcells organized as wordlines and bitlines. A bitcell may have an open state or closed state (or otherwise have a capacitor that is charged or uncharged). A bitline pre-charge 202 and a word inline decoder 204 are coupled to bank 200. A bitline decoder 206 is used for selecting bitlines. An optional bitline mux (multiplexer) 208 may be used to multiplex the outputs of sense amps 112.

To change the logic level for a cell, the cell's transistor is used to charge or discharge the capacitor. A charged capacitor represents a logic high, or '1', while a discharged capacitor represents a logic low, or '0'. The charging/discharging is done via the wordline and bitline. During a read or write, the wordline goes high and the transistor connects the capacitor to the bitline. Whatever value is on the bitline ('1' or '0') gets stored or retrieved from the capacitor. Thus, to access data in a given row, the wordline for the row is activated (this is also referred to as row activation).

Generally, the charge stored on each capacitor is too small to be read directly and is instead measured by a sense amplifier (e.g., sense amps 112). The sense amplifier detects the minute differences in charge and outputs the corresponding logic level. The act of reading from the bitline forces the charge to flow out of the capacitor. Thus, in DRAM, Reads are destructive. To get around this, an operation known as precharging is done to put the value read from the bitline back into the capacitor.

Equally problematic is the fact that the capacitors leak charge over time. Therefore, to maintain the data stored in memory the capacitors must be refreshed periodically. Refreshing works just like a read and ensures data is never lost. This is where DRAM gets the "Dynamic" moniker from—the charge on a DRAM cell is dynamically refreshed every so often (e.g., every 64 ms).

Under an RH attack, row or rows adjacent to a targeted row is/are read at a very high frequency. This results in repeated activation of the wordline(s) for the/those row(s). Under one embodiment, means are provided for detecting RH attacks on a DRAM die, such as depicted by an RH detector 212 in FIG. 2. Under one approach the RH detector is configured to count the number of activations of individual rows/wordlines within a configurable timeframe. If the number of activations exceeds some critical threshold (as applied to the timeframe), an RH attack is detected. For example, in one implementation the number of activations is 5000 within 75 microseconds (us). Generally, the timeframe and count threshold may vary as a function of the memory bandwidth and/or other considerations.

In accordance with aspects of the embodiments disclosed herein, two RH mitigation and prevention modes are provided in DRAM: 1) ALERT_n; and 2) polling. Under one aspect of polling, the CPU/host (e.g., memory controller) can change a DRAM RH counter threshold to a tighter value than under ALERT_n to enable earlier RH mitigation and recovery operations. In one embodiment, the ALERT_n and polling modes are selectable by toggling bit states in a mode register.

In addition to RH mitigation/prevention, a Central Processing Unit (CPU) and/or other host (e.g., memory controller) should be able to cater to Isochronous traffic (Quality of Service requirement for guaranteed bandwidth and bounded latency) bandwidth during RH mitigation. Accordingly, some embodiments provide RH mitigation and prevention while supporting Isochronous traffic bandwidth by limiting the number of ACTs that are allowed during RH recovery. Also, a novel RH handshaking method of RH polling between CPU/host and DRAM is provided.

Under various embodiments, DRAM that supports on-die RH mitigation (such as but not limited to DDR5 DRAM) may request a CPU host to back off so that it can keep up with the on-die RH mitigation. Two separate methods are provided for a handshake between DRAM and host. One is to use ALERT_n signal and the other is to poll a Mode Register (MR) bit in a mode register indicating the level of row hammering has reached a critical threshold. In one embodiment, a mode register bit or bits are used to enable the RH back off feature and then select one of the above two methods (ALERT_n or Polling) disclosed herein.

Row Hammer Back off Protocol using ALERT_n

For a Row Hammer triggered Alert_n, DDR5 DRAM that supports on-die row hammer mitigation may use an ALERT_n signal to provide better protection against attacks. The ALERT_n signal is an active low signal that is provided at a pin on the controller. Under this technique, DRAM asserts the ALERT_n signal and sets an MR bit in a mode register indicating that ALERT_n is asserted as part of RH mitigation. In one embodiment the DRAM continues to execute all commands (received from the controller) while ALERT_n is asserted so the DRAM internal state on a rank stays synchronized with other DRAMs on the same rank. This will mitigate any requirements on a host to replay commands. In addition, the host continues to send refresh commands while in an ALERT_n recovery state (also referred to an an RH mitigation state).

In one embodiment, an ALERT_n signal asserted in response to detection of an RH has a minimum pulse width of tRH_ALERT_PW_min. Generally, the ALERT_n signal pin may be used for other ALERT_n assertions, such as DQ CRC or Command Address (CA) parity errors from the Registered Clock Driver (RCD) (e.g., see DDR4 and DDR5 DRAM specifications) The use of tRH_ALERT_PW_min helps the host to distinguish an ALERT_n asserted in response to detection of an RH attack detection from ALERTs asserted for write DQ CRC or Command Address (CA) parity errors. This assumes that RCD is programmed for pulse width mode for CA parity errors. The host may optionally read the MR status to figure out the source of an ALERT_n assertion.

If the ALERT_n is still low at the end of tRH-_ALERT_PW_min then the host will send multiple RFM (Refresh Management) commands as defined by the value for RH_RFM in TABLE 1 below. The DRAM de-asserts ALERT_n after it has caught up with internal RH mitigation. Upon sampling ALERT_n high, the host will stop sending additional RFM commands. The DRAM also clears the MR bit that indicates RH mitigation is needed.

Supporting Isochronous Traffic Bandwidth During RH Mitigation

Another aspect of the RH mitigation methods disclosed herein is the ability to support isochronous traffic bandwidth during the RH mitigation/recovery operations. During the RH mitigation, in a system with RCD, a host will (or may) issue only RFM (Refresh management) and REF (Refresh) commands during the RH mitigation. Conversely, in a system without RCD, during the RH mitigation a host can issue normal DRAM commands to DRAM. However, the number of Activates are restricted by "RH_ACT" in TABLE 1.

TABLE 1

| Symbol | Description | Min | Max | Unit |
|---|---|---|---|---|
| RH_RFM | Required # of RFM during RH mitigation | 2 | 32 | |
| RH_ACT | Allowed # of ACT during RH mitigation | 0 | 4 | |
| tRH_ALERT_PW | RH Alert pulse width | 150 | — | ns |

Figure 3:
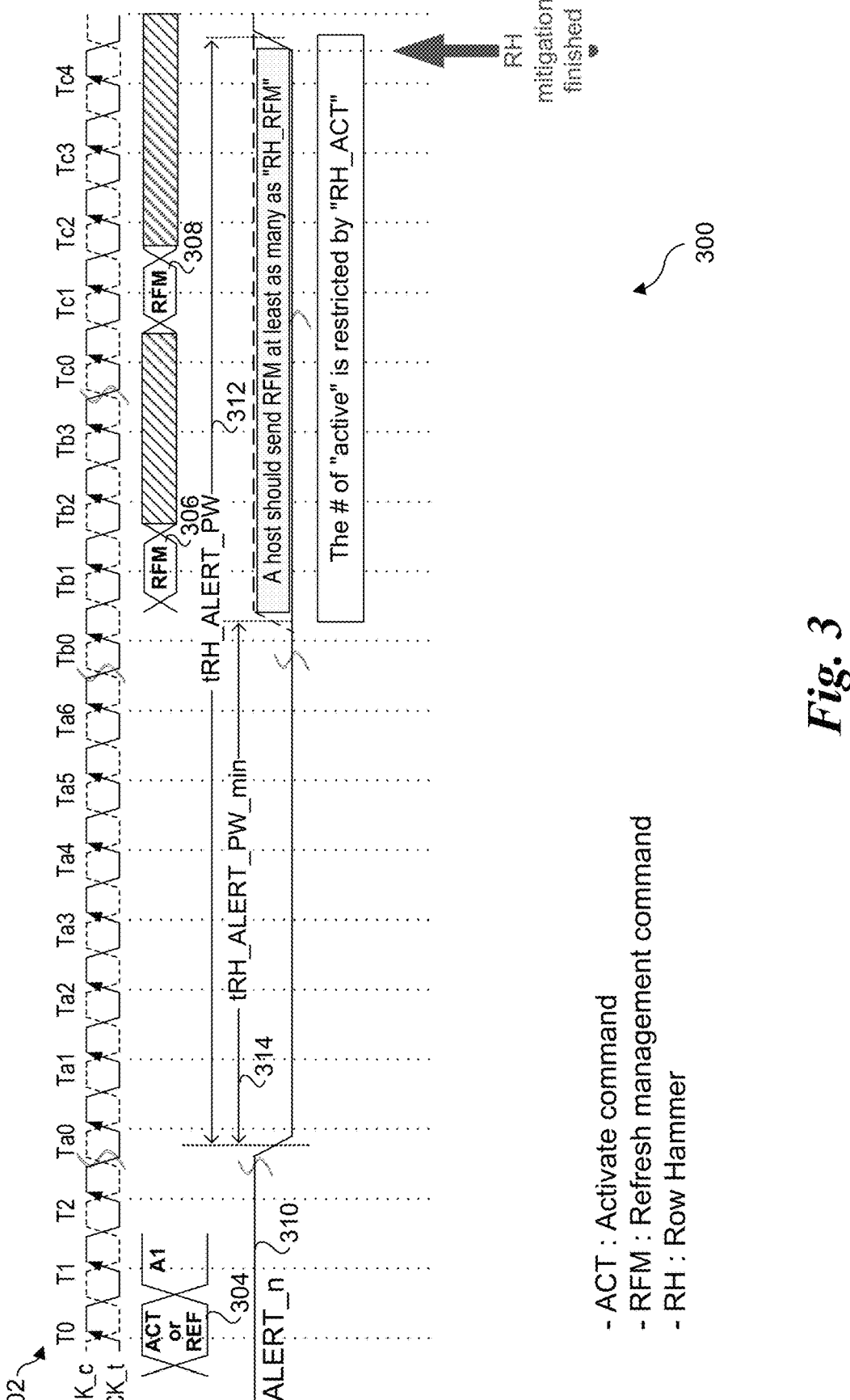
FIG. 3 is a timing diagram illustrating an example implementation of an RH ALERT_n mode, according to one embodiment.

FIG. 3 shows a timing diagram 300 illustrating an example implementation of the RH back off protocol using ALERT_n. A clock timing diagram (302) illustrating the states for CK_c and CK_t clock inputs is shown at the top FIG. 3, along with time indicators, such as T0, T1, T2, etc, for each clock cycle. The 'S' shaped symbols in the figures herein including FIG. 3 show breaks in the timeline, since an actual timeline over the time period depicted might have 10's of thousands of clock cycles. The middle section of the diagram depicts Activations (ACT) or Refreshes (REF) 304, and RFMs 306 and 308. The state (logic level) of the ALERT_n signal 310 is shown in the lower portion of timing diagram 300.

At time Ta0 the DRAM detects an RH attack and asserts ALERT_n, which changes the logic level of ALERT_n signal 310 from high to low. In addition to the change of the ALERT_n logic level, an MR bit is set to indicate RH mitigation is needed. As further shown, this begins a tRH-_ALERT_PW (RH_ALERT pulsewidth) time period 312 and tRH_ALERT_PW_min time period 314. At the end of tRH_ALERT_PW_min time period 314 the host has determined the ALERT_n assertion corresponds to an RH attack and begins an RH mitigation/recovery period by de-asserting ALERT_n (returning the logic level to '1'. During RH mitigation/recovery the host sends RFMs 306 and 308. As depicted, the host should send RFM at least as many as RH_RFM. During RH mitigation/recovery, the number of activations for the row is restricted by the RH_ACT value in TABLE 1.

In some embodiments, PDE (Power down enable)/PDX (Power down exit) and SREF (Self-refresh entry)/SRX (Self-refresh exit) are allowed during RH mitigation. In PDE/PDX, DRAM continues to assert ALERT_n, while the host will continue mitigation after exiting the power down state. In SREF mode, DRAM stops driving ALERT_n as low. Upon SRX, if DRAM still needs the host to back off then it will assert ALERT_n to continue mitigation.

In one embodiment a tRH_ALERT_Delay parameter is used to define the minimum amount of time before DRAM can (re)assert ALERT_n. Example values for the tRH-_ALERT_DELAY parameter are shown in TABLE 2 below.

TABLE 2

| Symbol | Description | Min | Max | Unit |
|---|---|---|---|---|
| tRH_ALERT_DELAY | Timing delay between RH_ALERT pulse. | 1000 | — | ns |

Figure 4:
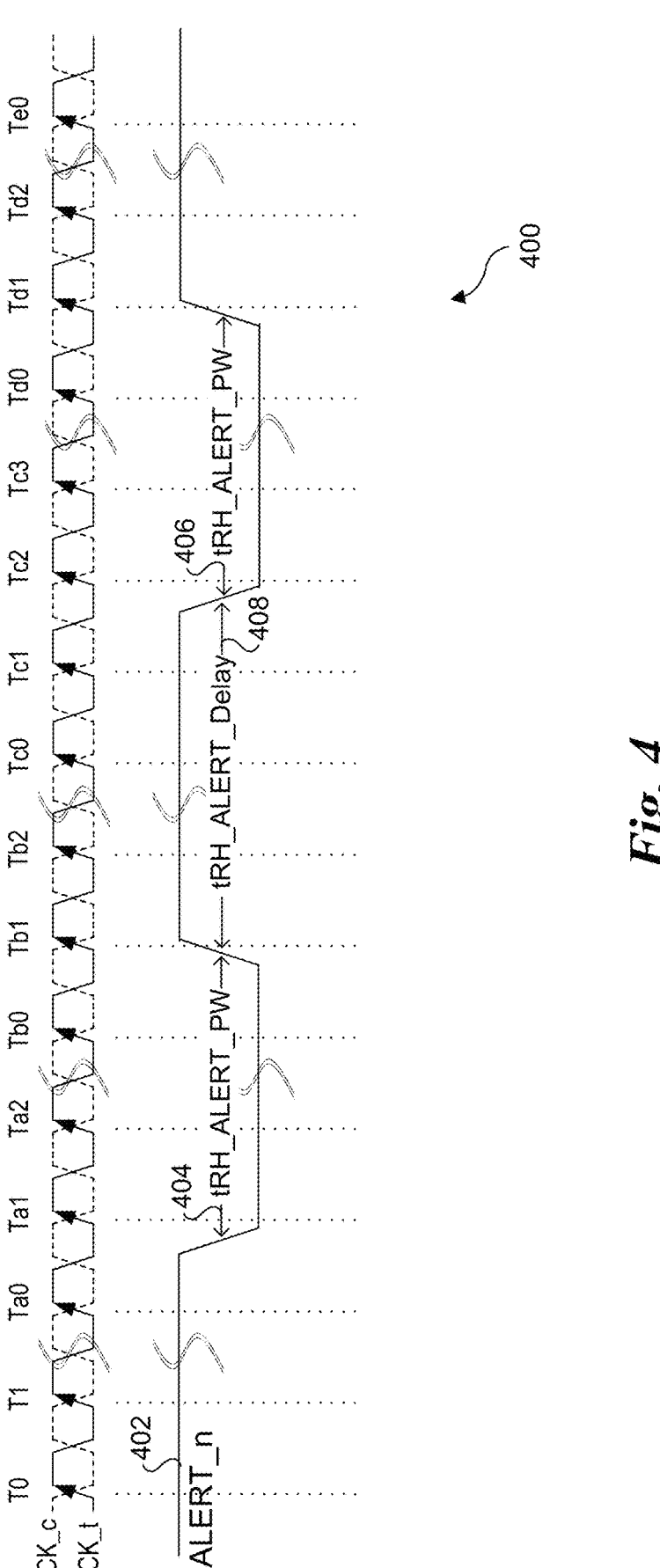
FIG. 4 is a timing diagram illustrating an example use of an RH alert delay period that is used to prevent the DRAM device from prevent the DRAM device from making non-stop RH mitigation requests, according to one embodiment.

FIG. 4 shows a timing diagram 400 illustrating the logic states of an ALERT_n signal 402 during tRH_ALERT_PW periods 404 and 406 and a tRH_ALERT_Delay period 408. A similar pattern may be repeated.

PDE (Power down enable)/PDX (Power down exit) and SREF (Self-refresh entry)/SRX (Self-refresh exit) are allowed during RH mitigation. In PDE/PDX, DRAM continues to assert ALERT_n'. Host will continue mitigation after exiting power down state.

In SREF mode, DRAM stops driving ALERT_n as low. Upon SRX, if DRAM still needs host to back off then it will assert ALERT_n to continue mitigation.

Row Hammer Polling

Under the Row Hammer polling method, DRAM can request host assistance for row hammer mitigation by using polling. DRAM sets a MR bit a mode register indicating that it has reached a critical threshold. In one embodiment, the host polls every tRH_Poll to check the status of the bit. As shown in TABLE 3 below, tRH_Poll is a parameter that may be changed. If the MR bit is set, then the recovery method is similar to the ALERT_n based method discussed above. The host sends multiple RFM commands as defined by RH_RFM in TABLE 1. The host will also read the MR status to check if DRAM has cleared the bit before it stops sending RFM commands. The host continues to send refresh commands while in row hammer recovery state.

TABLE 3

| Symbol | Description | Min | Max | Unit |
|---|---|---|---|---|
| tRH_Poll | RH MR bit status check interval | 6 | — | us |

Figure 5A:
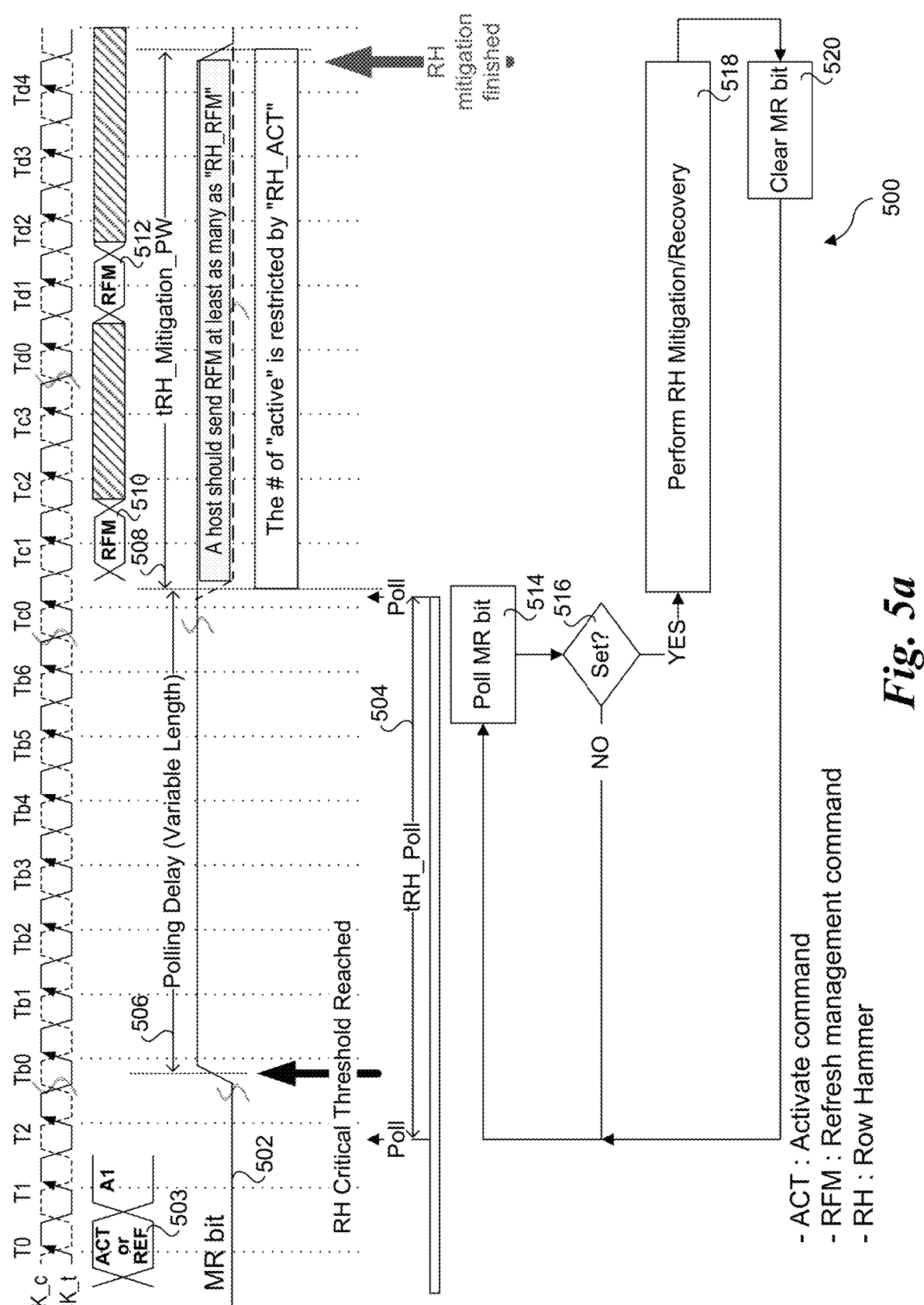
FIG. 5a is a timing diagram illustrating an example implementation of an RH polling mode, according to one embodiment.
Figure 5B:
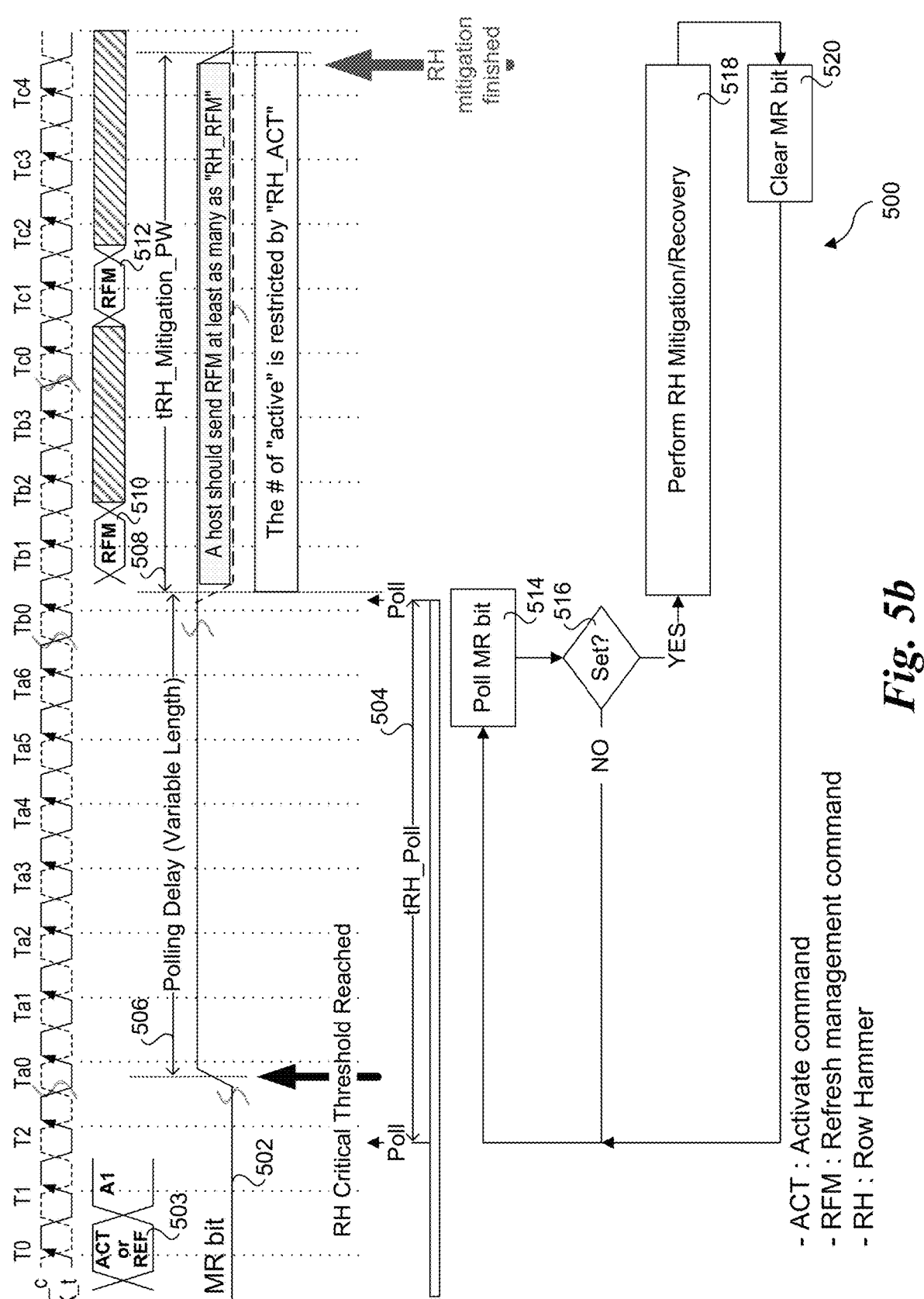
FIG. 5b shows the timing diagram of FIG. 5a with the timeline shifted to depict the result of lowering an RH critical threshold count.

Combination timing and flow diagrams illustrating examples of the RH polling method are shown in FIGS. 5a and 5*b*. As before, clock signals for CK_c and CK_t are shown at the top of the diagram, along with relative time values. An MR bit logic state 502 is shown in the lower part of the timing diagram portion of FIG. 5*a*. While the MR bit logic state is '0' (i.e., cleared), normal memory access operations are enabled, such as activations and refreshes 503.

Periodically, logic in the DRAM die or on the DRAM DIMM will poll the MR bit using a tRH_Poll polling interval 504 based on the value of tRH_Poll. During the first poll shown, the MR bit state is cleared. Subsequently, a time Tb0, a RH critical threshold is reached. For example, the critical threshold begins at 5000 activations in one embodiment (where those 5000 activations would be within a given sampling period having a predetermined duration). In response to reaching the RH critical threshold, the MR bit state is set (i.e., logic '1').

At this time, normal memory operations continue to be enabled until a second polling occurs, where the time between when the MR bit state is set and the MR bit is polled represents a variable length polling delay 506. The polling delay is variable because while the tRH_Poll polling interval 504 is periodic, the RH critical threshold condition may occur at any time thus is asynchronous to the polling. As a result, when the polling delay will the difference between which an RH critical threshold condition is reached and when the next MR bit poll occurs. Note, polling delay 506 will always be less than tRH_Poll polling interval 504.

Upon polling a set MR bit state, the host will initiate an RH mitigation/recovery over a tRH_Mitigation_PW period 508. The RH mitigation/recovery is similar to that shown in FIG. 3 for the ALERT_n method, including use of RFMs 510 and 512, where restrictions for RFMs and RH_ACT are defined in TABLE 1. At the conclusion of the tRH_Mitigation_PW 508 the host clears the MR bit to return its logic state to '0'. In one embodiment, tRH_Mitigation_PW 508 is a parameter managed by the host that can be modified.

As shown by the flow diagram portion of FIG. 5*a*, the MR bit is periodically polled in a block 514 using the rRH_Poll polling period. In a decision block 516 a determination is made to whether the MR bit is set. If it is not set, the answer to decision block 516 is NO and the logic loops back to block 514 to perform a next MR bit poll at the end of the next rRH_Poll polling period. If the MR bit is set, the answer to decision block 516 is YES, and the logic proceeds to perform RH mitigation and recovery in a block 518 during the tRH_Mitigation_PW period 508. Upon completion of the RH mitigation and recovery period the MR bit is cleared in a block 520 and the logic returns to perform the next MR bit poll in block 514.

As discussed and illustrated above, polling delay 506 will be variable. This polling delay may result in excessive RH activations before RH mitigation and recovery begins. This can be addressed in two ways: reduce tRH_Poll and/or reduce the RH critical threshold value. Under one embodiment, if a counter-based scheme such as perfect row hammer tracking (PRHT) is used where DRAM tracks the number of activates to any given row, then the DRAM will set the counter threshold to a lower value than used under the ALERT_n method. This will result in the host detecting the MR bit is set earlier. For example, suppose the rRC=60 ns and the host is polling every tRH_Poll or 6 us. If the threshold is reduced by 100, the MR bit set condition will be determined earlier.

An example of the result of reducing the RH critical threshold is shown in FIG. 5*b*, where the timeline value have been shifted (relative to those shown in FIG. 5*a*). In this example, since the RH critical threshold is reduced in FIG. 5*b*, the RH critical threshold condition occurs earlier at time Ta0 rather than time Tb0.

Under one embodiment of the polling method, the DRAM can provide the bank address (or addresses) that needs mitigation. This will allow host to send RFMpb (RFM per bank) commands as opposed to all bank commands. DRAM can also provide a count of the number of RFM commands needed for mitigation. This will help for more precise mitigation method without requiring the host to continuously poll to see if DRAM has caught up with the internal mitigation.

The embodiments described and illustrated herein provide several advantages over existing approaches. By having two RH modes the DRAM logic supporting these two modes can be implemented in systems with or without an ALERT_n pin. The polling mode also provides flexibility by tailoring the RH critical threshold values. The embodiments also have adjustable parameters to cater to isochronous traffic bandwidth during the RH mitigation/recovery operations.

Figure 6:
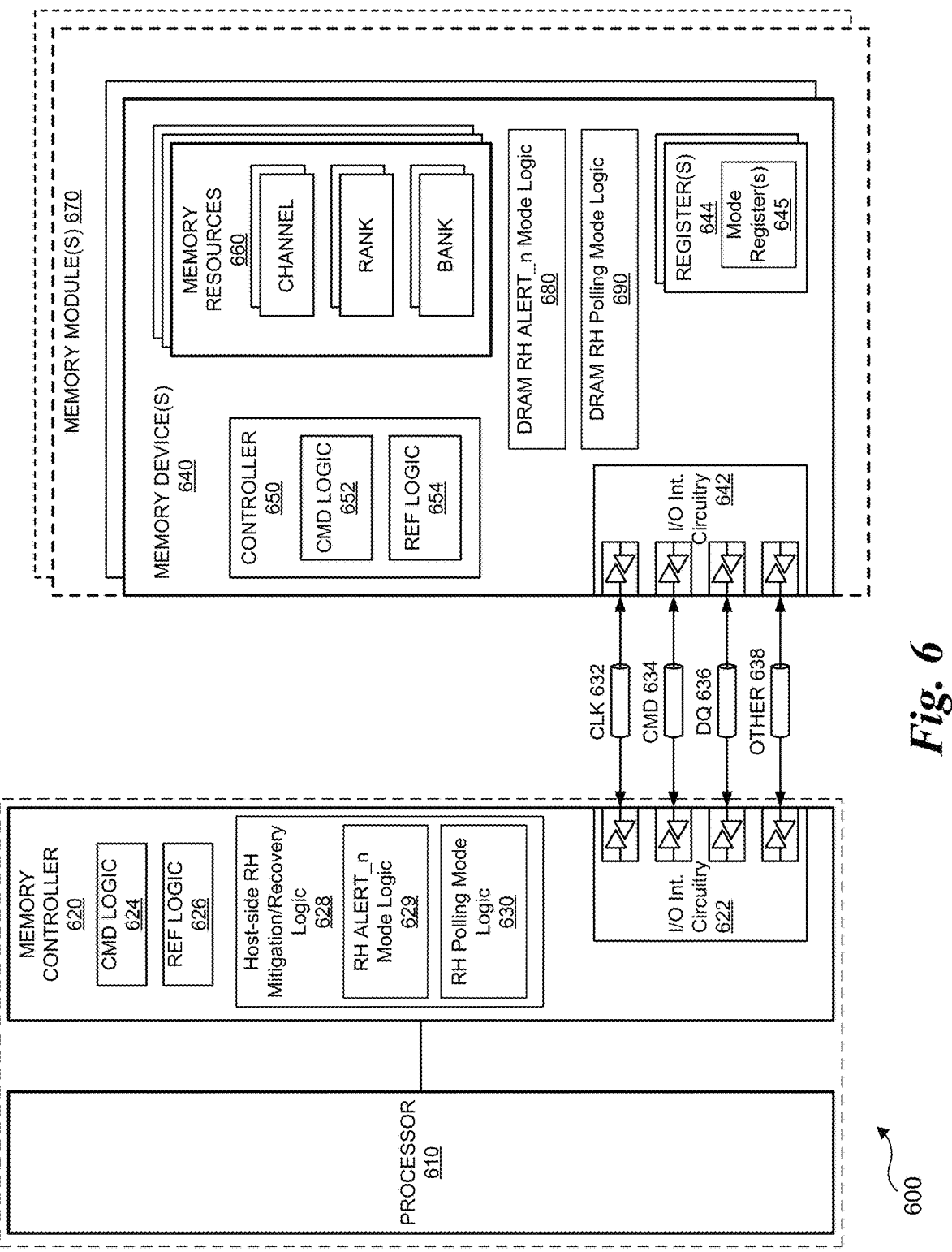
FIG. 6 is a schematic diagram of an example system including a memory controller coupled to memory modules, wherein the system is configured to implement RH mitigation operations in accordance with aspects of embodiments herein.

FIG. 6 illustrates an example system 600. In some examples, as shown in FIG. 6, system 600 includes a processor and elements of a memory subsystem in a computing device. Processor 610 represents a processing unit of a computing system that may execute an operating system (OS) and applications, which can collectively be referred to as the host or the user of the memory subsystem. The OS and applications execute operations that result in memory accesses. Processor 610 can include one or more separate processors. Each separate processor may include a single processing unit, a multicore processing unit, or a combination. The processing unit may be a primary processor such as a central processing unit (CPU), a peripheral processor such as a graphics processing unit (GPU), or a combination. Memory accesses may also be initiated by devices such as a network controller or hard disk controller. Such devices may be integrated with the processor in some systems or attached to the processer via a bus (e.g., a PCI express bus), or a combination. System 600 may be implemented as a system on a chip (SOC) or may be implemented with standalone components.

Descriptions referring to a "DRAM", "SDRAM, "DRAM device" or "SDRAM device" may refer to a volatile random access memory device. The memory device, SDRAM or DRAM may refer to the die itself, to a packaged memory product that includes one or more dies, or both. In some examples, a system with volatile memory that needs to be refreshed may also include at least some nonvolatile memory.

Memory controller 620, as shown in FIG. 6, may represent one or more memory controller circuits or devices for system 600. Also, memory controller 620 may include logic and/or features that generate memory access commands in response to the execution of operations by processor 610. In some examples, memory controller 620 may access one or more memory device(s) 640. For these examples, memory device(s) 640 may be SDRAM or DRAM devices in accordance with any referred to above. Memory device(s) 640 may be organized and managed through different channels, where these channels may couple in parallel to multiple memory devices via buses and signal lines. Each channel may be independently operable. Thus, separate channels may be independently accessed and controlled, and the timing, data transfer, command and address exchanges, and other operations may be separate for each channel. Coupling may refer to an electrical coupling, communicative coupling, physical coupling, or a combination of these. Physical coupling may include direct contact. Electrical coupling, for example, includes an interface or interconnection that allows electrical flow between components, or allows signaling between components, or both. Communicative coupling, for example, includes connections, including wired or wireless, that enable components to exchange data.

According to some examples, settings for each channel are controlled by separate mode registers or other register settings. For these examples, memory controller 620 may manage a separate memory channel, although system 600 may be configured to have multiple channels managed by a single memory controller, or to have multiple memory controllers on a single channel. In one example, memory controller 620 is part of processor 610, such as logic and/or features of memory controller 620 are implemented on the same die or implemented in the same package space as processor 610, sometimes referred to as an integrated memory controller or IMC.

Memory controller 620 includes Input/Output (I/O) interface circuitry 622 to couple to a memory bus, such as a memory channel as referred to above. I/O interface circuitry 622 (as well as I/O interface circuitry 642 of memory device(s) 640) may include pins, pads, connectors, signal lines, traces, or wires, or other hardware to connect the devices, or a combination of these. I/O interface circuitry 622 may include a hardware interface. As shown in FIG. 6, I/O interface circuitry 622 includes at least drivers/transceivers for signal lines. Commonly, wires within an integrated circuit interface couple with a pad, pin, or connector to interface signal lines or traces or other wires between devices. I/O interface circuitry 622 can include drivers, receivers, transceivers, or termination, or other circuitry or combinations of circuitry to exchange signals on the signal lines between memory controller 620 and memory device(s) 640. The exchange of signals includes at least one of transmit or receive. While shown as coupling I/O interface circuitry 622 from memory controller 620 to I/O interface circuitry 642 of memory device(s) 640, it will be understood that in an implementation of system 600 where groups of memory device(s) 640 are accessed in parallel, multiple memory devices can include I/O interface circuitry to the same interface of memory controller 620. In an implementation of system 600 including one or more memory module(s) 670, I/O interface circuitry 642 may include interface hardware of memory module(s) 670 in addition to interface hardware for memory device(s) 640. Other memory controllers 620 may include multiple, separate interfaces to one or more memory devices of memory device(s) 640.

In some examples, memory controller 620 may be coupled with memory device(s) 640 via multiple signal lines. The multiple signal lines may include at least a clock (CLK) 632, a command/address (CMD) 634, and write data (DQ) and read data (DQ) 636, and zero or more other signal lines 638. According to some examples, a composition of signal lines coupling memory controller 620 to memory device(s) 640 may be referred to collectively as a memory bus. The signal lines for CMD 634 may be referred to as a "command bus", a "C/A bus" or an ADD/CMD bus, or some other designation indicating the transfer of commands. The signal lines for DQ 636 may be referred to as a "data bus".

According to some examples, independent channels may have different clock signals, command buses, data buses, and other signal lines. For these examples, system 600 may be considered to have multiple "buses," in the sense that an independent interface path may be considered a separate bus. It will be understood that in addition to the signal lines shown in FIG. 6, a bus may also include at least one of strobe signaling lines, alert lines, auxiliary lines, or other signal lines, or a combination of these additional signal lines. It will also be understood that serial bus technologies can be used for transmitting signals between memory controller 620 and memory device(s) 640. An example of a serial bus technology is 8B10B encoding and transmission of high-speed data with embedded clock over a single differential pair of signals in each direction. In some examples, CMD 634 represents signal lines shared in parallel with multiple memory device (s) 640. In other examples, multiple memory devices share encoding command signal lines of CMD 634, and each has a separate chip select (CS_n) signal line to select individual memory device(s) 640.

In some examples, the bus between memory controller 620 and memory device(s) 640 includes a subsidiary command bus routed via signal lines included in CMD 634 and a subsidiary data bus to carry the write and read data routed via signal lines included in DQ 636. In some examples, CMD 634 and DQ 636 may separately include bidirectional lines. In other examples, DQ 636 may include unidirectional write signal lines to write data from the host to memory and unidirectional lines to read data from the memory to the host.

According to some examples, in accordance with a chosen memory technology and system design, signals lines included in other 638 may augment a memory bus or subsidiary bus. For example, strobe line signal lines for a DQS. Based on a design of system 600, or memory technology implementation, a memory bus may have more or less bandwidth per memory device included in memory device(s) 640. The memory bus may support memory devices included in memory device(s) 640 that have either a x32 interface, a x16 interface, a x8 interface, or other interface. The convention "xW," where W is an integer that refers to an interface size or width of the interface of memory device(s) 640, which represents a number of signal lines to exchange data with memory controller 620. The interface size of these memory devices may be a controlling factor on how many memory devices may be used concurrently per channel in system 600 or coupled in parallel to the same signal lines. In some examples, high bandwidth memory devices, wide interface memory devices, or stacked memory devices, or combinations, may enable wider interfaces, such as a x128 interface, a x256 interface, a x512 interface, a x1024 interface, or other data bus interface width.

According to some examples, memory device(s) 640 represent memory resources for system 600. For these examples, each memory device included in memory device (s) 640 is a separate memory die. Separate memory devices may interface with multiple (e.g., 2) channels per device or die. A given memory device of memory device(s) 640 may include I/O interface circuitry 642 and may have a bandwidth determined by an interface width associated with an implementation or configuration of the given memory device (e.g., x16 or x8 or some other interface bandwidth). I/O interface circuitry 642 may enable the memory devices to interface with memory controller 620. I/O interface circuitry 642 may include a hardware interface and operate in coordination with I/O interface circuitry 622 of memory controller 620.

In some examples, multiple memory device(s) 640 may be connected in parallel to the same command and data buses (e.g., via CMD 634 and DQ636). In other examples, multiple memory device(s) 640 may be connected in parallel to the same command bus but connected to different data buses. For example, system 600 may be configured with multiple memory device(s) 640 coupled in parallel, with each memory device responding to a command, and accessing memory resources 660 internal to each memory device. For a write operation, an individual memory device of memory device(s) 640 may write a portion of the overall data word, and for a read operation, the individual memory device may fetch a portion of the overall data word. As non-limiting examples, a specific memory device may provide or receive, respectively, 8 bits of a 128-bit data word for a read or write operation, or 8 bits or 16 bits (depending for a x8 or a x16 device) of a 256-bit data word. The remaining bits of the word may be provided or received by other memory devices in parallel.

According to some examples, memory device(s) 640 may be disposed directly on a motherboard or host system platform (e.g., a PCB (printed circuit board) on which processor 610 is disposed) of a computing device. Memory device(s) 640 may be organized into memory module(s) 670. In some examples, memory module(s) 670 may represent dual inline memory modules (DIMMs). In some examples, memory module(s) 670 may represent other organizations or configurations of multiple memory devices that share at least a portion of access or control circuitry, which can be a separate circuit, a separate device, or a separate board from the host system platform. In some examples, memory module(s) 670 may include multiple memory device(s) 640, and memory module(s) 670 may include support for multiple separate channels to the included memory device(s) 640 disposed on them.

In some examples, memory device(s) 640 may be incorporated into a same package as memory controller 620. For example, incorporated in a multi-chip-module (MCM), a package-on-package with through-silicon via (TSV), or other techniques or combinations. Similarly, in some examples, memory device(s) 640 may be incorporated into memory module(s) 670, which themselves may be incorporated into the same package as memory controller 620. It will be appreciated that for these and other examples, memory controller 620 may be part of or integrated with processor 610.

As shown in FIG. 6, in some examples, memory device(s) 640 include memory resources 660. Memory resources 660 may represent individual arrays of memory locations or storage locations for data. Memory resources 660 may be managed as rows of data, accessed via wordline (rows) and bitline (individual bits within a row) control. Memory resources 660 may be organized as separate channels, ranks, and banks of memory. Channels may refer to independent control paths to storage locations within memory device(s) 640. Ranks may refer to common locations across multiple memory devices (e.g., same row addresses within different memory devices). Banks may refer to arrays of memory locations within a given memory device of memory device(s) 640. Banks may be divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to access memory resources 660. For example, the same physical memory locations can be accessed over a specific channel as a specific bank, which can also belong to a rank. Thus, the organization of memory resources 660 may be understood in an inclusive, rather than exclusive, manner.

According to some examples, as shown in FIG. 6, memory device(s) 640 include one or more register(s) 644.

Register(s) 644 may represent one or more storage devices or storage locations that provide configuration or settings for operation memory device(s) 640. In one example, register(s) 644 may provide a storage location for memory device(s) 640 to store data for access by memory controller 620 as part of a control or management operation. For example, register(s) 644 may include one or more mode registers (MRs) 645 and/or may include one or more multipurpose registers.

In some examples, writing to or programming one or more registers of register(s) 644 may configure memory device(s) 640 to operate in different "modes". For these examples, command information written to or programmed to the one or more register may trigger different modes within memory device(s) 640. Additionally, or in the alternative, different modes can also trigger different operations from address information or other signal lines depending on the triggered mode. Programmed settings of register(s) 644 may indicate or trigger configuration of I/O settings. For example, configuration of timing, termination, on-die termination (ODT), driver configuration, or other I/O settings.

In some examples, as shown in FIG. 6, memory device(s) 640 includes controller 650. Controller 650 may represent control logic within memory device(s) 640 to control internal operations within memory device(s) 640. For example, controller 650 decodes commands sent by memory controller 620 and generates internal operations to execute or satisfy the commands. Controller 650 may be referred to as an internal controller and is separate from memory controller 620 of the host. Controller 650 may include logic and/or features to determine what mode is selected based on programmed or default settings indicated in register(s) 644 and configure the internal execution of operations for access to memory resources 660 or other operations based on the selected mode. Controller 650 generates control signals to control the routing of bits within memory device(s) 640 to provide a proper interface for the selected mode and direct a command to the proper memory locations or addresses of memory resources 660. Controller 650 includes command (CMD) logic 652, which can decode command encoding received on command and address signal lines. Thus, CMD logic 652 can be or include a command decoder. With command logic 652, memory device can identify commands and generate internal operations to execute requested commands.

Referring again to memory controller 620, memory controller 620 includes CMD logic 624, which represents logic and/or features to generate commands to send to memory device(s) 640. The generation of the commands can refer to the command prior to scheduling, or the preparation of queued commands ready to be sent. Generally, the signaling in memory subsystems includes address information within or accompanying the command to indicate or select one or more memory locations where memory device(s) 640 should execute the command. In response to scheduling of transactions for memory device(s) 640, memory controller 620 can issue commands via I/O interface circuitry 622 to cause memory device(s) 640 to execute the commands. In some examples, controller 650 of memory device(s) 640 receives and decodes command and address information received via I/O interface circuitry 642 from memory controller 620. Based on the received command and address information, controller 650 may control the timing of operations of the logic, features and/or circuitry within memory device(s) 640 to execute the commands. Controller 650 may be arranged to operate in compliance with standards or specifications such as timing and signaling requirements for memory device(s) 640. Memory controller 620 may implement compliance with standards or specifications by access scheduling and control.

In some examples, memory controller 620 includes refresh (REF) logic 626. REF logic 626 may be used for memory resources that are volatile and need to be refreshed to retain a deterministic state. REF logic 626, for example, may indicate a location for refresh, and a type of refresh to perform. REF logic 626 may trigger self-refresh within memory device(s) 640 or execute external refreshes which can be referred to as auto refresh commands by sending refresh commands, or a combination. According to some examples, system 600 supports all bank refreshes as well as per bank refreshes. All bank refreshes cause the refreshing of banks within all memory device(s) 640 coupled in parallel. Per bank refreshes cause the refreshing of a specified bank within a specified memory device of memory device(s) 640. In some examples, controller 650 within memory device(s) 640 includes a REF logic 654 to apply refresh within memory device(s) 640. REF logic 654, for example, may generate internal operations to perform refresh in accordance with an external refresh received from memory controller 620. REF logic 654 may determine if a refresh is directed to memory device(s) 640 and determine what memory resources 660 to refresh in response to the command.

Memory device(s) 640 further include logic for implementing the DRAM-side of the RH ALERT_n and RH polling methods described and illustrated herein, as depicted by RH ALERT_n mode logic 680 and RH Polling mode logic 690. Parameters in TABLES 1-3 above may be part of these logic blocks or may be stored elsewhere, such as in registers 644.

As further illustrated, memory controller 620 includes host-side RH mitigation/recovery mode logic 628 including RH ALERT_n mode logic 629 and RH polling mode logic 630. This logic is used to perform the host-side aspects of the RH ALERT_n and RH polling modes described herein. Although shown as part of memory controller 620, all or a portion of the host-side RH mitigation/recovery mode logic may be implemented on processor 610 when memory controller 620 is not integrated on processor 610.

Figure 7:
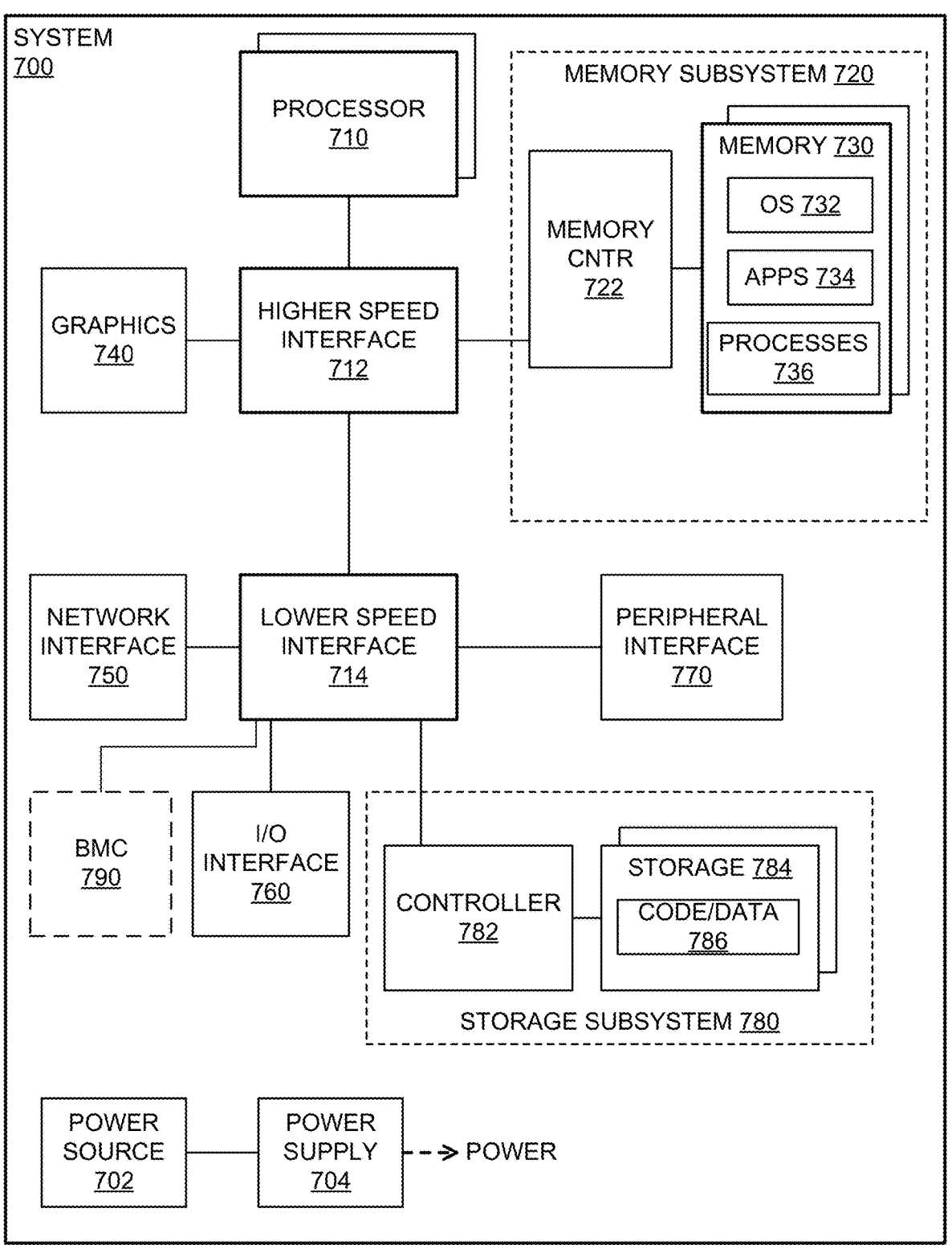
FIG. 7 is a block diagram of an exemplary system in which aspects of the embodiments disclosed herein may be implemented.

FIG. 7 illustrates an example compute platform 700 in which aspects of the embodiments may be practiced. Compute platform 700 represents a computing device or computing system in accordance with any example described herein, and can be a server, laptop computer, desktop computer, or the like. More generally, compute platform 700 is representative of any type of computing device or system employing DRAM DIMMs.

Compute platform 700 includes a processor 710, which provides processing, operation management, and execution of instructions for compute platform 700. Processor 710 can include any type of microprocessor, central processing unit (CPU), graphics processing unit (GPU), processing core, or other processing hardware to provide processing for compute platform 700, or a combination of processors. Processor 710 controls the overall operation of compute platform 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, compute platform 700 includes interface 712 coupled to processor 710, which can represent a higher speed interface or a high throughput interface for system components that needs higher bandwidth connections, such as memory subsystem 720 or graphics interface components 740. Interface 712 represents an interface circuit, which can be a standalone component or integrated onto a processor die. Where present, graphics interface 740 interfaces to graphics components for providing a visual display to a user of compute platform 700. In one example, graphics interface 740 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touch-screen display. In one example, graphics interface 740 generates a display based on data stored in memory 730 or based on operations executed by processor 710 or both.

Memory subsystem 720 represents the main memory of compute platform 700 and provides storage for code to be executed by processor 710, or data values to be used in executing a routine. Memory 730 of memory subsystem 720 may include one or more memory devices such as DRAM DIMMs, read-only memory (ROM), flash memory, or other memory devices, or a combination of such devices. Memory 730 stores and hosts, among other things, operating system (OS) 732 to provide a software platform for execution of instructions in compute platform 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for compute platform 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710.

While not specifically illustrated, it will be understood that compute platform 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper-Transport or industry standard architecture (ISA) bus, a small computer system interface (SCSI) bus, a universal serial bus (USB), or an Institute of Electrical and Electronics Engineers (IEEE) standard 1394 bus.

In one example, compute platform 700 includes interface 714, which can be coupled to interface 712. Interface 714 can be a lower speed interface than interface 712. In one example, interface 714 represents an interface circuit, which can include standalone components and integrated circuitry. In one example, multiple user interface components or peripheral components, or both, couple to interface 714. Network interface 750 provides compute platform 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can exchange data with a remote device, which can include sending data stored in memory or receiving data to be stored in memory.

In one example, compute platform 700 includes one or more I/O interface(s) 760. I/O interface(s) 760 can include one or more interface components through which a user interacts with compute platform 700 (e.g., audio, alphanumeric, tactile/touch, or other interfacing). Peripheral interface 770 can include any hardware interface not specifically mentioned above. Peripherals refer generally to devices that connect dependently to compute platform 700. A dependent connection is one where compute platform 700 provides the software platform or hardware platform or both on which operation executes, and with which a user interacts.

In one example, compute platform 700 includes storage subsystem 780 to store data in a nonvolatile manner. In one example, in certain system implementations, at least certain components of storage subsystem 780 can overlap with components of memory subsystem 720. Storage subsystem 780 includes storage device(s) 784, which can be or include any conventional medium for storing large amounts of data in a nonvolatile manner, such as one or more magnetic, solid state, or optical based disks, or a combination. Storage device(s) 784 holds code or instructions and data 786 in a persistent state (i.e., the value is retained despite interruption of power to compute platform 700). A portion of the code or instructions may comprise platform firmware that is executed on processor 710. Storage device(s) 784 can be generically considered to be a "memory," although memory 730 is typically the executing or operating memory to provide instructions to processor 710. Whereas storage device(s) 784 is nonvolatile, memory 730 can include volatile memory (i.e., the value or state of the data is indeterminate if power is interrupted to compute platform 700). In one example, storage subsystem 780 includes controller 782 to interface with storage device(s) 784. In one example controller 782 is a physical part of interface 714 or processor 710 or can include circuits or logic in both processor 710 and interface 714.

Compute platform 700 may include an optional Baseboard Management Controller (BMC) 790 that is configured to effect the operations and logic corresponding to the flowcharts disclosed herein. BMC 790 may include a microcontroller or other type of processing element such as a processor core, engine or micro-engine, that is used to execute instructions to effect functionality performed by the BMC. Optionally, another management component (standalone or comprising embedded logic that is part of another component) may be used.

Power source 702 provides power to the components of compute platform 700. More specifically, power source 702 typically interfaces to one or multiple power supplies 704 in compute platform 700 to provide power to the components of compute platform 700. In one example, power supply 704 includes an AC to DC (alternating current to direct current) adapter to plug into a wall outlet. Such AC power can be renewable energy (e.g., solar power) power source 702. In one example, power source 702 includes a DC power source, such as an external AC to DC converter. In one example, power source 702 can include an internal battery or fuel cell source.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

As discussed above, various aspects of the embodiments herein may be facilitated by corresponding software and/or firmware components and applications, such as software and/or firmware executed by an embedded processor or the like. Thus, embodiments of this invention may be used as or to support a software program, software modules, firmware, and/or distributed software executed upon some form of processor, processing core or embedded logic a virtual machine running on a processor or core or otherwise implemented or realized upon or within a non-transitory computer-readable or machine-readable storage medium. A non-transitory computer-readable or machine-readable storage medium includes any mechanism for storing or transmitting information in a form readable by a machine (e.g., a computer). For example, a non-transitory computer-readable or machine-readable storage medium includes any mechanism that provides (i.e., stores and/or transmits) information in a form accessible by a computer or computing machine (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A non-transitory computer-readable or machine-readable storage medium may also include a storage or database from which content can be downloaded. The non-transitory computer-readable or machine-readable storage medium may also include a device or product having content stored thereon at a time of sale or delivery. Thus, delivering a device with stored content, or offering content for download over a communication medium may be understood as providing an article of manufacture comprising a non-transitory computer-readable or machine-readable storage medium with such content described herein.

Various components referred to above as processes, servers, or tools described herein may be a means for performing the functions described. The operations and functions performed by various components described herein may be implemented by software running on a processing element, via embedded hardware or the like, or any combination of hardware and software. Such components may be implemented as software modules, hardware modules, special-purpose hardware (e.g., application specific hardware, ASICs, DSPs, etc.), embedded controllers, hardwired circuitry, hardware logic, etc. Software content (e.g., data, instructions, configuration information, etc.) may be provided via an article of manufacture including non-transitory computer-readable or machine-readable storage medium, which provides content that represents instructions that can be executed. The content may result in a computer performing various functions/operations described herein.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A host apparatus comprising a memory controller configured to control a Dynamic Random Access Memory (DRAM) device having a plurality of memory cells arranged in rows and columns, comprising:
input/output (I/O) interface circuitry to receive signals from and send signals to an I/O interface on a DRAM device;
polling circuitry to poll for row hammer (RH) indicia on the DRAM device, the RH indicia generated by the DRAM device and indicating whether the DRAM device has detected a row hammer attack for one or more rows of memory cells; and
RH mitigation circuitry to perform host-side operations in connection with an RH mitigation and/or recovery process under which the host apparatus sends commands via the I/O interface circuitry to the DRAM device to be implemented by the DRAM device during the RH mitigation and/or recovery process.

2. The host apparatus of claim 1, further comprising circuitry for adjusting a RH detection threshold value on the DRAM device, wherein the host apparatus communicates an RH detection threshold value to the DRAM device via the I/O interface circuitry or programs an RH detection threshold value in a register on the DRAM device.

3. The host apparatus of claim 1, wherein the RH mitigation circuitry is configured to coordinate with RH mitigation circuitry on the DRAM device to ensure an isochronous traffic bandwidth requirement is met during the RH mitigation and/or recovery process.

4. The host apparatus of claim 3, wherein the DRAM device stores an RH_ACT parameter defining a limit of activations that may be performed during the RH mitigation and/or recovery process, and wherein the RH mitigation circuitry is configured to Read the RH_ACT parameter value and issue Refresh Management commands and at least one of memory read and memory write commands to DRAM device during the RH mitigation and/or recovery process, wherein a number of row activations associated with the at least one of memory read and memory write commands is less than the RH_ACT parameter value.

5. The host apparatus of claim 1, wherein the RH mitigation circuitry is further configured to use a RH alert delay to prevent the DRAM device from making non-stop RH mitigation requests.

6. The host apparatus of claim 1, wherein the RH indicia comprises a bit in a register on the DRAM device, and the polling circuitry periodically reads the bit.

7. The host apparatus of claim 1, wherein the I/O interface circuitry includes an ALERT_n pin, further comprising RH ALERT_n mode circuitry implementing an RH mitigation mode that is triggered by an ALERT_n signal received at the ALERT_n pin from the DRAM device, wherein in response to the ALERT_n signal the RH ALERT_n mode circuitry is configured to:
determine the ALERT_n signal corresponds to an RH alert; and
employ the RH mitigation circuitry to perform host-side operations in connection with the RH mitigation and/or recovery process.

8. The host apparatus of claim 1, wherein the host apparatus is a System on Chip (SoC) including an integrated memory controller.

9. A Dynamic Random Access Memory (DRAM) device, comprising:

plurality of memory cells arranged in rows and columns;

input/output (I/O) interface circuitry to receive signals from and send signals to an I/O interface on a host, the I/O interface including an ALERT_n signal line;

row hammer (RH) detection circuitry to detect a RH attack on one or more rows of memory cells and generate RH indicia indicating an RH attack has been detected; and means for setting RH mode comprising one of an RH ALERT_n mode and an RH polling mode, wherein, in response to detection of an RH attack, the DRAM device is configured to, assert a logic low signal on the ALERT_n signal line when the RH mode is set to the RH ALERT_n mode; or modify RH indicia stored on the DRAM device when the RH mode is set to the RH polling mode.

10. The DRAM device of claim 9, wherein the RH mode setting is a bit in a mode register.

11. The DRAM device of claim 9, wherein the RH indicia is a bit in a mode register that is toggled to indicate a RH attack has been detected or RH mitigation is needed.

12. The DRAM device of claim 9, wherein the RH detection circuitry comprises a counter that is used to count row activations, and an RH attack is detected when the counter reaches a critical threshold.

13. The DRAM device of claim 12, wherein the DRAM device includes means for storing an adjustable RH critical threshold value; and wherein the DRAM device employs a current value of the RH critical threshold value for the counter critical threshold.

14. The DRAM device of claim 12, further comprising DRAM-side RH mitigation logic that is configured to cooperate with host-side RH mitigation logic on the host to ensure an isochronous traffic bandwidth requirement is met during an RH mitigation and/or recovery process implemented on the DRAM device.

15. The DRAM device of claim 14, further comprising DRAM-side RH mitigation logic and circuitry for at least one of storing and reading an RH alert delay parameter, wherein the DRAM-side RH mitigation logic is further configured to implement an RH alert delay based on the RH alert delay parameter to prevent the DRAM device from asserting non-stop RH mitigation requests.

16. A system comprising:

a Dynamic Random Access Memory (DRAM) device, including, a plurality of memory cells arranged in rows and columns;

input/output (I/O) interface circuitry to receive signals from and send signals to an I/O interface on a memory controller, row hammer (RH) detection circuitry to detect a RH attack on one or more rows of memory cells and generate RH indicia indicating an RH attack has been detected; and first RH mitigation circuitry to perform DRAM-side operations in connection with an RH mitigation and/or recovery process; and a host apparatus comprising the memory controller, including, I/O interface circuitry to receive signals from and send signals to the I/O interface circuitry on the DRAM device;

polling circuitry to poll for the row hammer (RH) indicia on the DRAM device; and second RH mitigation circuitry to perform host-side operations in connection with an RH mitigation and/or recovery process under which the host apparatus sends commands via the I/O interface circuitry to the DRAM device to be implemented by the first RH mitigation circuitry on the DRAM device during the RH mitigation and/or recovery process.

17. The system of claim 16, wherein the RH indicia is a bit in a mode register that is toggled to indicate a RH attack has been detected.

18. The system of claim 16, wherein the first RH mitigation circuitry on the DRAM device is configured to coordinate with the second RH mitigation circuitry on the memory controller to ensure an isochronous traffic bandwidth and latency requirement is met during the RH mitigation and/or recovery process.

19. The system of claim 16, wherein the RH detection circuitry comprises a counter that is used to count row activations and an RH attack is detected when the counter reaches a critical threshold, and wherein the DRAM device employs an adjustable RH critical threshold value for the counter critical threshold.

20. The system of claim 18, wherein the I/O interface circuitry on the DRAM includes an ALERT_n signal line, and wherein the DRAM device further includes means for setting an RH mode setting comprising one of an RH ALERT_n mode and an RH polling mode, wherein, in response to detection of an RH attack, the DRAM device is configured to, assert a logic low signal on the ALERT_n signal line when the RH mode is set to the RH ALERT_n mode; or modify RH indicia stored on the DRAM device when the RH mode is set to the RH polling mode.

* * * * *